United States Patent
Matthews et al.

[11] Patent Number: 5,848,019
[45] Date of Patent: Dec. 8, 1998

[54] PASS GATE DECODER FOR A MULTIPORT MEMORY DEVICE THAT USES A SINGLE PORTED MEMORY CELL ARRAY STRUCTURE

[75] Inventors: Frank D. Matthews, Duluth; Robert H. Bishop, Lawrenceville; Bruce L. Chin, Duluth, all of Ga.

[73] Assignee: Integrated Device Technology, Inc., Santa Clara, Calif.

[21] Appl. No.: 920,737

[22] Filed: Aug. 29, 1997

[51] Int. Cl.$^6$ .................................................. G11C 7/00
[52] U.S. Cl. .............................. 365/230.06; 365/230.05
[58] Field of Search ..................... 365/230.05, 230.06, 365/230.08, 230.09

[56] References Cited

U.S. PATENT DOCUMENTS

| | | | |
|---|---|---|---|
| 4,103,349 | 7/1978 | Marmet | 365/231 |
| 4,354,266 | 10/1982 | Cooperman | 370/112 |
| 4,651,029 | 3/1987 | Oritani | 365/230 |
| 4,660,178 | 4/1987 | Hardee | 365/189 |
| 4,964,078 | 10/1990 | Jandu | 365/51 |
| 5,126,970 | 6/1992 | Ul Haq | 365/154 |
| 5,233,233 | 8/1993 | Inoue | 364/784 |
| 5,282,175 | 1/1994 | Fujita | 365/230.06 |
| 5,337,273 | 8/1994 | McClure | 365/168 |
| 5,376,829 | 12/1994 | Rogers | 327/408 |
| 5,565,804 | 10/1996 | Maochuan | 327/99 |
| 5,598,114 | 1/1997 | Jamshidi | 326/113 |
| 5,717,638 | 9/1998 | Kim | 365/230.05 |

*Primary Examiner*—David C. Nelms
*Assistant Examiner*—David Lam
*Attorney, Agent, or Firm*—Pillsbury, Madison & Sutro

[57] ABSTRACT

Described is a last stage decoder that generates a local word line signal within a bank of a single-ported memory cell array structure. The decoder inputs predecoded global row address signals, as well as predecoded local row address signals. In order to generate the local word line signal, and thus access a memory cell within a given bank, both one predecoded global row address signal, as well as one predecoded local row address signal must be present. The predecoded local row address signal turns on a pass gate transistor, and allows the predecoded global row address signal to pass through the pass gate transistor and create the local word line signal.

20 Claims, 4 Drawing Sheets

5,848,019

PASS GATE DECODER FOR A MULTIPORT MEMORY DEVICE THAT USES A SINGLE PORTED MEMORY CELL ARRAY STRUCTURE

FIELD OF THE INVENTION

The present invention relates to a decoder, and, more particularly, a decoder for a multi-port memory device that uses a single-ported memory cell array structure.

BACKGROUND OF THE RELATED ART

Integrated circuit memory chip devices that allow more than one external device to access the memory chip device are well known. Dual ported memory devices, for example, advantageously allow two external devices to simultaneously access each of the memory cells in the dual ported memory device. This simultaneous access is achieved, however, at the expense of more complicated circuitry and increased die size.

One alternative to simultaneous access, such as is found in a dual ported memory device, is a multi-ported memory device that uses a single-ported memory cell array structure. In such an arrangement, the memory chip uses a known single ported memory cell array structure, and contains on-chip decoders, multiplexers, and arbitration circuits to determine which ports can have access to the memory cells. With such arrangements, simultaneous access is permitted in certain circumstances, but not in others. For example, simultaneous access for two external devices that access data stored in different banks of the memory cell array may be permitted, whereas simultaneous access for two external devices that access data stored in the same bank of the memory cell array may not be permitted.

One of the benefits of a multi-ported memory device that uses a single-ported memory cell array structure is that the memory cell array structure occupies much less area. Accordingly, circuits which have the capability of efficiently functioning with such a single-ported memory cell array structure are desireable.

SUMMARY OF THE INVENTION

It is, therefore, an object of the present invention to provide a decoder that can be used in a multi-ported memory device that uses a single-ported memory cell array structure that does not require a large portion of the memory device chip area.

It is another object of the present invention to provide such a decoder that is used as the last decoding stage of a local word line and can arbitrate access to a single local word line, which access may be requested from a plurality of external devices.

It is another object of the present invention to provide such a last stage decoder that implements a pass gate decoder.

It is another object of the present invention to provide such a last stage decoder that is capable of high speed operation.

It is still a further object of the present invention to provide such last stage decoder that is located adjacent or in proximity to the memory bank to which it relates.

In order to achieve the above object of the present invention, among others, the present invention implements a last stage decoder that generates a local word line signal within a bank of a single-ported memory cell array structure. The decoder inputs are predecoded global row address signals, as well as predecoded local row address signals. In order to generate the local word line signal, and thus access a memory cell within a given bank, both one predecoded global row address signal, as well as one predecoded local row address signal must be present. The predecoded local row address signal turns on a pass gate transistor, and allows the predecoded global row address signal to pass through the pass gate transistor and create the local word line signal.

Such a circuit arrangement is extremely efficient in terms of using minimal area of the memory device chip area and also quite fast.

BRIEF DESCRIPTION OF THE DRAWINGS

These and other objects, features and advantages of the present invention are better understood by reading the following detailed description of the preferred embodiment, taken in conjunction with the accompanying drawings, in which.

DETAILED DESCRIPTION OF THE PREFERRED EMBODIMENT

Figure 1:
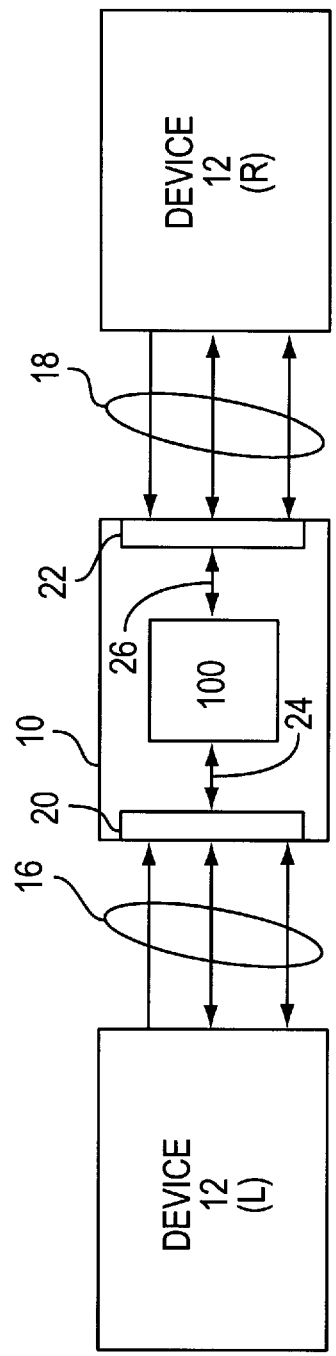
FIG. 1 illustrates a multi-ported memory device that uses a single-ported memory cell array structure according to the present invention connected to two external devices.

FIG. 1 illustrates a multi-port memory device 10 according to the present invention, which contains memory cells arranged in rows and columns that can be written to and read from by each of two external electronic devices 12L and 12R, respectively, which may be, for example, microprocessors and controller chips.

Data, address, and control lines, collectively illustrated as bus 16 in FIG. 1, connect external device 12L to the multi-port memory device 10, whereas external device 12R is connected to memory device 10 by data, address, and control lines, collectively illustrated as bus 18 in FIG. 1. Input/output pad groups 20 and 22, respectively provide for connection terminals to buses 16 and 18. The input/output pad groups 20 and 22 establish signal paths to the integrated memory circuits 100 that makes up the multi-port memory device 10 via internal buses 24 and 26 which respectively connect to the integrated memory circuits 100 that includes a single-ported memory cell array structure, which will be described further with reference to FIG. 2. For an implementation with a static ram device, a conventional four transistor memory cell structure is preferably used.

Figure 2:
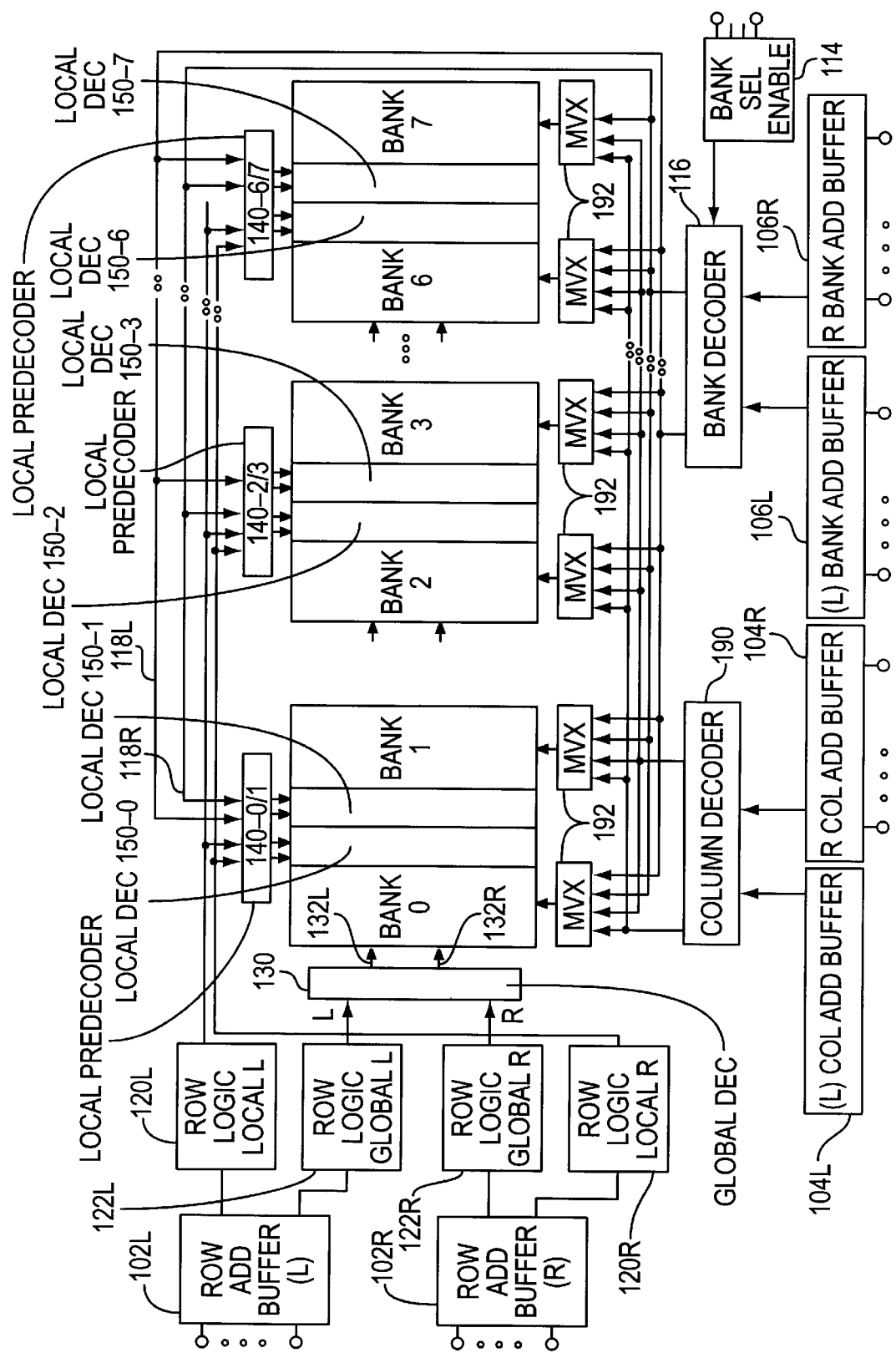
FIG. 2 illustrates the multi-ported memory device that uses a single-ported memory cell array structure according to the present invention.

As illustrated in FIG. 2 row address buffer 102L, column address buffer 104L, and bank address buffer 106L receive address signals from external device 12L, whereas row address buffer 102R, column address 104R and bank address buffer 106R receive address signals from external device 12R.

Data input and output paths are not shown in FIG. 2, in which these paths input and output data to and from the integrated memory circuits 100 to the input/output pad groups 20 and 22. Data can therefore be written to and read from the appropriate memory cell in the appropriate memory bank using data buses as is conventionally known.

Also illustrated in FIG. 2 is a bank enable circuit 114, which receives bank enable signals from each of external devices 12L and 12R indicating the bank that the external memory device desires to access.

The bank select enable circuit 114 ensures that the same memory bank is not selected from both the external device 12L and the external device 12R at the same time. Bank address inputs from the left bank address buffer 106L that are input into the bank decoder 116 result in a bank enable signal corresponding to external device 12L being transmitted along bank enable bus 118L when that bank is selected by bank select enable circuit 114, and the same bank cannot, therefore, be enabled even if requested by the other external device. Similarly, address signals from bank address buffer 106R are input to the bank decoder 116 such that a right bank enable signal is transmitted along one of the signal lines within the bank enable bus 118R to the appropriate bank when that bank is selected by bank select enable circuit 114. The generated bank enable signals ensure that each bank is only accessed by one external device at a time, as will be explained in further detail hereinafter.

As also illustrated in FIG. 2, row logic global L circuit 122L and row logic global R circuit 122R are predecoders that receive address signals from row address buffers 102L and 102R respectively, and output partially predecoded global address signals to global decoder 130. Global decoder then generates global predecode signals along global predecode signal lines 132R and 132L, respectively. Although not shown in details, the decoders within row logic global circuits 122L and 122R, as well as global decoder 130, are primarily AND, NAND or NOR circuits that tie together different address lines to obtain the global predecode signals along global predecode lines 132L and 132R. Although only two such signals are shown in FIG. 2, it is understood that many such global predecode signal lines exist and pass through each of the memory banks 0–7. There are only, however, two such global predecode signals that exist at any given time, as determined by the address input by the external device 12L and the external device 12R.

Row logic local circuits 120L and 120R, as well as local predecoders 140-0/1 through 140-6/7 also decode address signals that are input from each of external devices 12L and 12R. In the preferred embodiment, the row logic circuits 120L and 120R decode address bits input from the external devices 12L and 12R, and then input the decoded address signals into the local predecoders 140, which are then used in the manner as will be described hereinafter. The outputs from the local predecoders 140 are input into the local decoders 150, labeled in FIG. 2 as local decoders 150-0 through 150-7, one local decoder corresponding to each memory bank.

Figure 3:
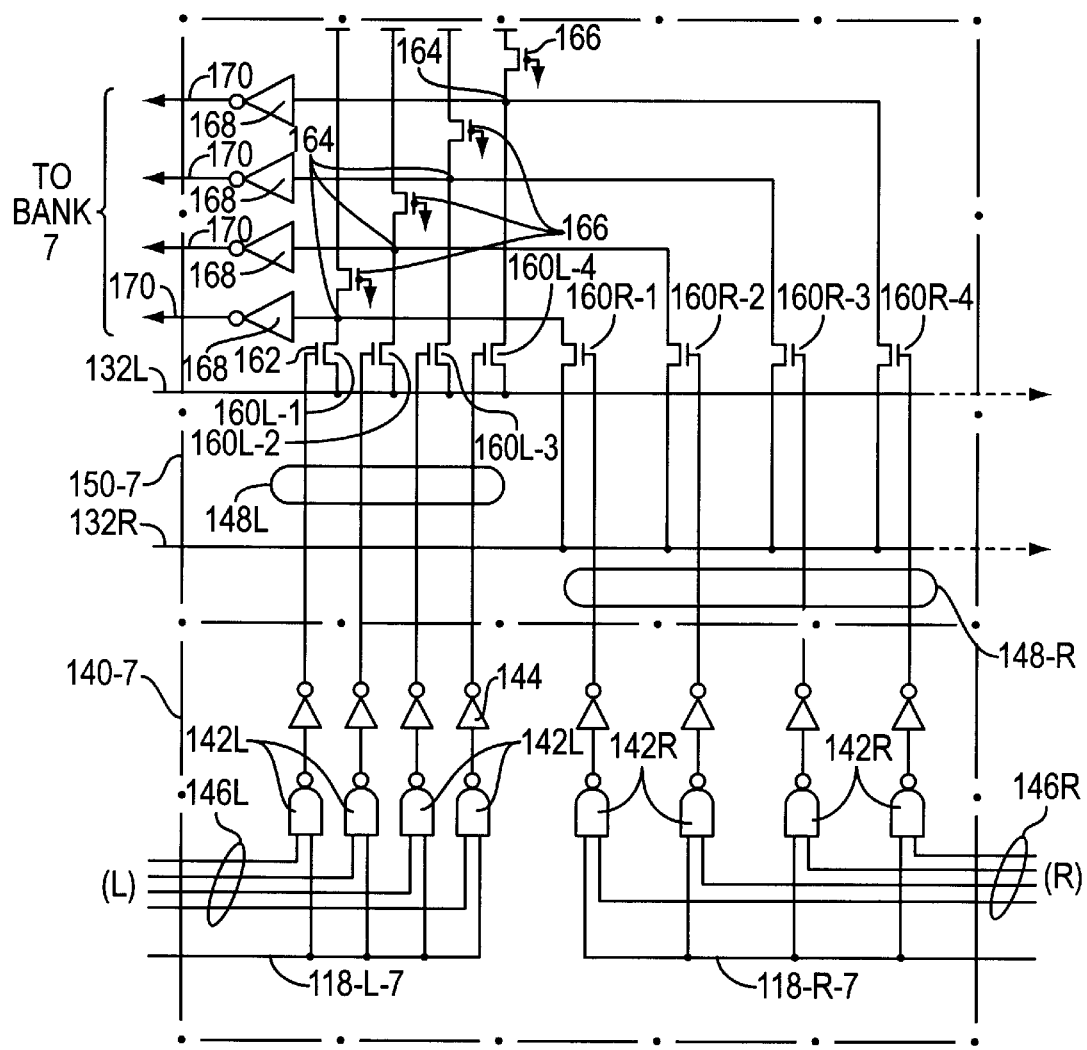
FIG. 3 illustrates one embodiment of a last stage pass gate decoder according to the present invention.

A portion of the local predecoder 140-7 and the local decoder 150 are illustrated further in FIG. 3, which will now be described. FIG. 3 illustrates a portion of the local predecoder 140-7 which corresponds to the local predecoder that serves bank 7 illustrated in FIG. 2. The portion of the local predecoder 140 that is shown corresponds to that portion necessary to assist in generating four different word line signals within the memory bank 7. As will be understood, the same circuit structure illustrated in FIG. 3 is simply repeated in order to generate the requisite number of local word lines to service the bank, depending upon the size of the memory device being contemplated.

The local predecoder 140-7 consists of a plurality of NAND gates 142 which NAND gates are labels 142L and 142R, corresponding to those NAND gates that receive as inputs the decoded address signals 146L and 146R from the external devices 12L and 12R illustrated in FIG. 1. Another input to each of the NAND gates 142L is the bank enable signal 118L-7 indicating that this particular bank should be enabled for access by external device 12L. Similarly, each of the NAND gates 142R have as an input the bank enabled signal line 118R-7 which transmits the bank enable signal for bank 7 indicating that bank 7 can be addressed by the external device 12R. Accordingly, either NAND gates 142L or NAND gates 142R will be enabled at any given point in time. Inverters 144 are shown as part of local predecoder 140 to illustrate that inverters can be added as required to facilitate timing and/or logic requirements. The outputs from the local predecoder 140-7 are predecoded local address signals transmitted along predecoded local address signal lines 148L and 148R, corresponding to the word line that needs to be accessed for the requested memory cell, which is also dependent upon which one of the external devices makes the request. Thus, predecoded local address signals transmitted along local address signal lines 146L provide the predecoded addresses corresponding to the external device 12L whereas the predecoded address signals transmitted along local address signal lines 146R correspond to the external device 12R.

The local decoder circuit 150-7 includes pass gate transistors 160L and 160R, which each have a gate 162 that is connected to one of the predecoded local address signal lines 148L and 148R.

The source of each of pass gate transistors 160L is connected to the global row address line 132L, whereas the sources of pass gate transistors 160R are connected to the global row address signal line 132R.

Furthermore, each pass gate transistor 160L has its drain connected to the drain of one of pass gate transistors 160R. The two pass gate transistors 160L and 160R that are so connected are those transistors which have the same corresponding local address, but are associated with address requests from different external devices. Accordingly, as illustrated in FIG. 3, pass gate transistor 160L-1 has its drain tied to a common node 164, to which is also connected the drain of pass gate transistor 160R-1. FIG. 3 also illustrates the common connection of pass gate transistors 160L-2 through 160L-4 with respective drains of pass gate transistors 160R-2 through 160R-4. Furthermore, connected between Vcc and the node 164 is a biasing transistor 166. An inverter 168 is then connected between each local word line 170 and the common node 164 previously referenced.

It should be noted that each of inverters 168 is preferably comprised of conventional CMOS transistors. Furthermore, the pair of transistors that make up inverter 168, as well as the pass gate transistors 160 are large in comparison to the size of the PMOS biasing transistors 166. In the presently preferred implementation, the two CMOS transistors that make up each inverter 168 have channels widths that are about twice as wide as the channel widths of the pass gate transistors 160, which, in turn, are about twice as wide as the channel widths of the biasing transistors 166.

Figure 4:
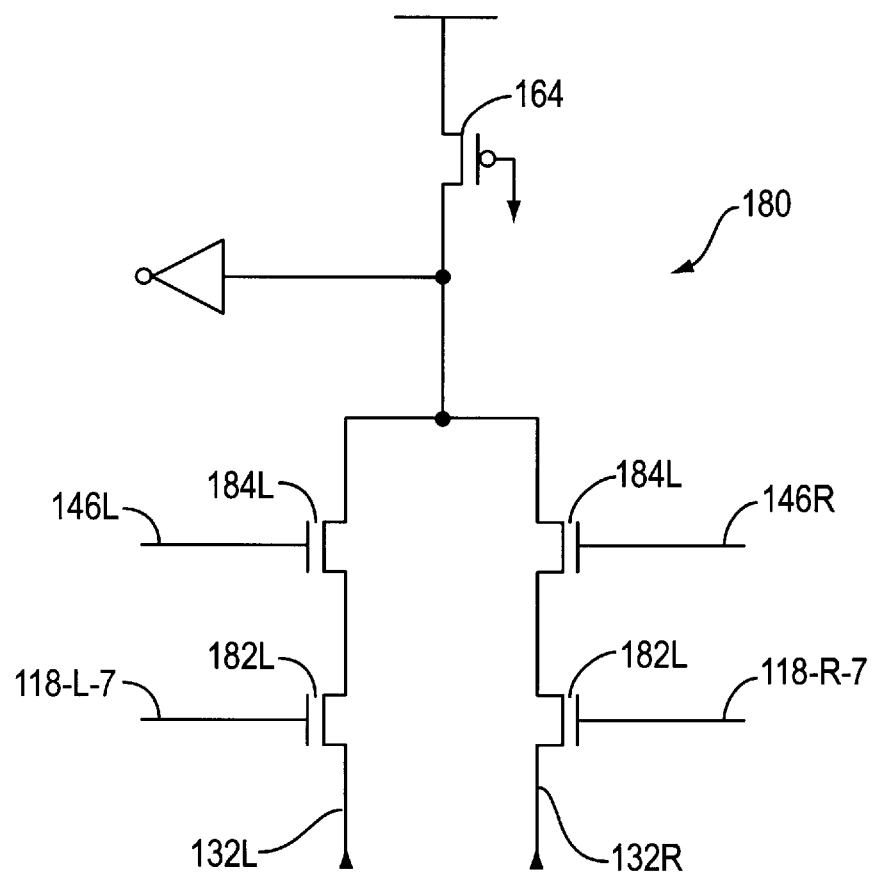
FIG. 4 illustrates another embodiment of a last stage pass gate decoder according to the present invention.

FIG. 4 illustrates an alternate embodiment of the local predecoder 140, and, specifically, the local decoder 142 illustrated in FIG. 3. Only the decode sections corresponding to a single local word line are illustrated. As illustrated, in this embodiment, rather than implementing a local predecoder that is used for the bank select operation, a pass gate decoder 180 includes a series connection of block select pass gate transistors 182 and row select pass gate transistors 184. Accordingly, in this embodiment, one of the predecoded global row address signals transmitted along global row address lines 132L and 132R must pass through both of pass gate transistors 182 and 184 in order to generate the local word line signal along output 186. More specifically, bank select signals, such as the bank select signals for bank 7 transmitted along bank bus signal line 118L-7 and 118R-7 respectively, as described previously with reference to FIG. 3, are used to turn on respective block select pass gate transistors 182L and 182R as shown in FIG. 4, whereas decoded row address signals input to the respective gates of row address pass gate transistors 184L and 184R, such as the row address signals transmitted along row address signal lines 146R and 146L, respectively, as described previously with reference to FIG. 3.

Such a configuration of the decoder as used in FIG. 4 can also be used to implement the column decoder/bank select logic that is otherwise shown as conventional column decoders 190 and multiplexers 192 in FIG. 2.

While the preferred embodiment and details of the invention have been described above, it will be apparent to those skilled in the art that various changes and modification may be made without departing from the scope of the invention. For example, an NMOS inverter with a bootstrap circuit could be used in place of the CMOS inverter, voltage sources having different voltages could be used for the voltage sources attached to the inverter and bias transistors, other types of transistors used to implement circuits described herein, and other circuits that perform the same functions as the circuits described herein could be used. Accordingly, the invention is properly defined by the claims below.

We claim:

1. A decoder for generating a select line signal on a select line within one of a plurality of banks of a single-port memory cell array disposed within a multi-port integrated circuit memory device that is capable of communicating with first and second external devices and coupled to a voltage source, said decoder comprising:

first and second inputs for respectively receiving said first and second predecoded global address signals, said first and second predecoded global address signals respectively associated with said first and second external devices;

third and fourth inputs for respectively receiving first and second predecoded local address signals, said first and second predecoded local address signals respectively associated with said first and second external devices;

a common node;

a first switching means for passing said first predecoded global address signal to said common node when said first predecoded local address signal is applied to said first gate and thereby resulting in said select line signal on said select line; and a second switching means for passing said second predecoded global address signal to said common node when said second predecoded local address signal is applied to said second gate and thereby resulting in said select line signal on said select line, only one of said first and second predecoded local address signals being received for selection of said select line during the same period of time.

2. A decoder according to claim 1, further including:

a biasing transistor coupled between said voltage source and said common node; and an inverter coupled between said common node and said select line for inverting said select line signal.

3. A decoder according to claim 2, wherein said first switching means includes a first pass gate transistor having a first gate coupled to said third input, a first source coupled to said first input, and a first drain coupled to said common node; and wherein said second switching means includes a second pass gate transistor having a second gate coupled to said fourth input, a second source coupled to said second input, and a second drain coupled to said common node.

4. A decoder according to claim 3 wherein said inverter comprises CMOS transistors, said pass gate transistors are NMOS transistors and said biasing transistor is a PMOS transistor.

5. A decoder according to claim 1, wherein said first switching means includes a first pass gate transistor having a first gate coupled to said third input, a first source coupled to said first input, and a first drain coupled to said common node; and wherein said second switching means includes a second pass gate transistor having a second gate coupled to said fourth input, a second source coupled to said second input, and a second drain coupled to said common node.

6. A decoder according to claim 5 wherein said pass gate transistors are NMOS transistors.

7. A decoder according to claim 1 further including respective pluralities of said first, second, third and fourth inputs, said common nodes, and said first and second switching means, so that said decoder can select one of a plurality of said select lines.

8. A decoder according to claim 1 that operates as a row decoder.

9. A decoder according to claim 1 that operates as a column decoder.

10. A decoder for generating a select line signal on a select line within one of a plurality of banks of a single-port memory cell array disposed within a multi-port integrated circuit memory device that is capable of communicating with first and second external devices and coupled to a voltage source, said decoder comprising:

first and second inputs for respectively receiving said first and second predecoded global address signals, said first and second predecoded global address signals respectively associated with said first and second external devices;

third and fourth inputs for respectively receiving first and second predecoded local address signals, said first and second predecoded local address signals respectively associated with said first and second external devices;

a first pass gate transistor having a first gate coupled to said third input, a first source coupled to said first input, and a first drain, said first pass gate transistor passing said first predecoded global address signal to said first drain when said first predecoded local address signal is applied to said first gate and thereby resulting in said select line signal on said select line; and a second pass gate transistor having a second gate coupled to said fourth input, a second source coupled to said second input, and a second drain, said second drain being coupled to said first drain at a common node, said second pass gate transistor passing said second predecoded global address signal to said second drain when said second predecoded local address signal is applied to said second gate and thereby resulting in said select line signal on said select line, only one of said first and second predecoded local address signals being received for selection of said select line during the same period of time.

11. A decoder according to claim 10 further including a biasing transistor coupled between said voltage source and said common node; and an inverter coupled between said common node and said select line for inverting said select line signal.

12. A decoder according to claim 11 wherein said inverter comprises CMOS transistors, said pass gate transistors are NMOS transistors and said biasing transistor is a PMOS transistor.

13. A decoder according to claim 11 wherein said pass gate transistors are NMOS transistors.

14. A decoder according to claim 11 further including respective pluralities of said first, second, third and fourth inputs, said common node, and said first and second pass gate transistors, so that said decoder can select one of a plurality of said select lines.

15. A decoder according to claim 11 that operates as a row decoder.

16. A decoder according to claim 11 that operates as a column decoder.

17. An integrated circuit multiport memory device capable of communicating with first and second external devices and is coupled to a voltage source comprising:

a plurality of memory banks, each of said plurality of memory banks including a single port memory cell array arranged in rows and columns;

first and second address inputs for inputting address signals from said first and second external devices;

first and second address decoders for decoding first predetermined ones of said address signals from each of said first and second address inputs to obtain first and second predecoded local address signals;

a global address decoder for decoding second predetermined ones of said address signals from each of said first and second address inputs to obtain first and second predecoded global address signals; and a pass gate decoder for generating a select line signal on a select line, said select line being one of a word line and a column select line within one of said plurality of banks, said decoder comprising:

first and second inputs for respectively receiving said first and second predecoded global address signals, said first and second predecoded global address signals respectively associated with said first and second external devices;

third and fourth inputs for respectively receiving first and second predecoded local address signals, said first and second predecoded local address signals respectively associated with said first and second external devices;

a first pass gate transistor having a first gate coupled to said third input, a first source coupled to said first input, and a first drain, said first pass gate transistor passing said first predecoded global address signal to said first drain when said first predecoded local address signal is applied to said first gate and thereby resulting in said select line signal on said select line; and a second pass gate transistor having a second gate coupled to said fourth input, a second source coupled to said second input, and a second drain, said second drain being coupled to said first drain at a common node, said second pass gate transistor passing said second predecoded global address signal to said second drain when said second predecoded local address signal is applied to said second gate and thereby resulting in said select line signal on said select line, only one of said first and second predecoded local address signals being received for selection of said select line during the same period of time.

18. A decoder according to claim 17 further including a biasing transistor coupled between said voltage source and said common node; and an inverter coupled between said common node and said select line for inverting said select line signal.

19. An integrated circuit multiport memory device according to claim 18 wherein said inverter comprises CMOS transistors, said pass gate transistors are NMOS transistors and said biasing transistor is a PMOS transistor.

20. A decoder according to claim 17 further including respective pluralities of said first, second, third and fourth inputs, said common node, and said first and second pass gate transistors, so that said decoder can select one of a plurality of said select lines.

* * * * *